United States Patent
Kucherov et al.

(10) Patent No.: US 7,302,375 B2
(45) Date of Patent: Nov. 27, 2007

(54) SIMULATION OF PROCESSES, DEVICES AND CIRCUITS BY A MODIFIED NEWTON METHOD

(75) Inventors: Andrey Kucherov, Mountain View, CA (US); Victor Moroz, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 350 days.

(21) Appl. No.: 10/929,286

(22) Filed: Aug. 30, 2004

(65) Prior Publication Data
US 2006/0047737 A1 Mar. 2, 2006

(51) Int. Cl.
G06F 7/60 (2006.01)
G06F 17/50 (2006.01)
G01V 1/40 (2006.01)

(52) U.S. Cl. ............... 703/13; 364/148; 703/2; 703/13; 716/1; 716/4; 702/7

(58) Field of Classification Search ............ 703/13; 364/148; 702/7; 716/1, 4
See application file for complete search history.

(56) References Cited

U.S. PATENT DOCUMENTS

| | | | | |
|---|---|---|---|---|
| 4,918,643 | A * | 4/1990 | Wong | 703/4 |
| 5,047,971 | A * | 9/1991 | Horwitz | 703/14 |
| 5,572,434 | A * | 11/1996 | Wang et al. | 700/197 |
| 5,729,451 | A * | 3/1998 | Gibbs et al. | 702/12 |
| 5,963,724 | A * | 10/1999 | Mantooth et al. | 703/14 |
| 6,144,932 | A * | 11/2000 | Hachiya | 703/14 |
| 6,151,698 | A * | 11/2000 | Telichevesky et al. | 716/1 |
| 6,636,839 | B1 * | 10/2003 | Telichevesky et al. | 706/1 |
| 6,662,148 | B1 * | 12/2003 | Adler et al. | 703/11 |
| 6,748,349 | B1 * | 6/2004 | Majumdar et al. | 703/9 |
| 2003/0018459 | A1 * | 1/2003 | O'Riordan et al. | 703/14 |

OTHER PUBLICATIONS

Bellido, Anne-Mercedes. 'Construction of Iteration Functions for the Simultaneous Computation of the Solutions of Equations and Algebraic Systems'. Numerical Algorithms 6: 1994. pp. 317-351.*
Snowden, Christopher. 'Semiconductor Device Modeling'. Rep. Prog. Phys., vol. 48, 1985: pp. 223-375.*
Stephen J. Wright, "Modified Cholesky factorizations in interior-point algorithms for linear programming," SIAM Journal on Optimization 9 (1999), pp. 1159-1191.
J.E. Dennis, Jr. and R.B. Schnabel, Numerical Methods for Unconstrained Optimization and Nonlinear Equations, SIAM, 1996.

* cited by examiner

*Primary Examiner*—Kamini Shah
*Assistant Examiner*—Shambhavi Patel
(74) *Attorney, Agent, or Firm*—Warren S. Wolfeld; Haynes, Beffel & Wolfeld LLP

(57) ABSTRACT

Roughly described, a method for numerically solving a system of equations of the form $$0=F(X),$$

for a solution vector X which involves choosing a starting value $X_0$ and iterating $$X_{n+1}=X_n-[F'(X_n)+\sigma_n \text{Diag } F'(X_n)]^{-1}F(X_n).$$

In this iteration, at least one $\sigma_n$ is a number greater than 0. Preferably, $$\sigma_n=\min\{\beta/n,\ [\alpha_n/(1+n\alpha_n)]\|F(X_n)\|\},$$

where $\beta$ is a constant that remains fixed for all n, and $$\alpha_n=\|F(X_n)\|/\|F(X_{n-1})\|.$$

64 Claims, 7 Drawing Sheets

SIMULATION OF PROCESSES, DEVICES AND CIRCUITS BY A MODIFIED NEWTON METHOD

BACKGROUND

1. Field of the Invention

The invention relates to numerical methods for simulating semiconductor fabrication processes, devices and circuits, and more particularly to a modification of the Newton Method for improved convergence behavior in such applications.

2. Description of Related Art

Numerical modeling and simulation has become an indispensable tool for the optimal design of semiconductor devices. As the dimensions of semiconductor devices continue to decrease, numerical simulation plays an important role in helping transistor designers develop strategies to overcome the design limits. Numerical modeling is used extensively also for simulating fabrication processes, such as the diffusion of dopants in a substrate. In digital and analog circuit design and analysis, numerical modeling of circuit simulations is used to assist in circuit verification.

Modeling of problems in these fields often requires finding solutions (roots) to problems of the form $F(X)=0$, where F is a nonlinear function and $X \in \mathbb{R}^m$. In most cases, this is a multidimensional problem $(m>1)$, in which case F is a system of m nonlinear functions $$F(X) = \begin{bmatrix} F_1(x_1, \ldots, x_m) \\ \ldots \\ F_m(x_1, \ldots, x_m) \end{bmatrix}$$

in m variables $$X=(x_1, x_2, \ldots, x_m).$$

Only rarely can solutions to these problems be found in closed form; usually they must be calculated using numerical methods. As used herein, unless the context indicates otherwise, lower case letters represent scalars whereas upper case letters represent matrices, vectors or vectors of functions. Lower case letters either are scalar analogs of the matrices or vectors represented by the corresponding upper case letters, or are scalar elements in the matrices or vectors represented by the corresponding upper case letters.

The Newton Method is one well-known iterative numerical method for solving problems of this form, given an initial guess $X_0$. The method can be derived in the 1-dimensional case by instead finding a simplifying approximation of the function $F(X)$, and finding a root of that approximation. If the approximation was good enough, then the root of the approximation will be a reasonable approximation of the root $X^*$ of $F(X)$. In the Newton Method, the approximation is usually taken as the straight line tangent to $F(X)$ at an initial approximation $X_0$ of the root $X^*$. If $X_0$ is close enough to $X^*$, then the root of the straight line, $X_1$, should be closer still to $X^*$. A new straight line approximation of $F(X)$ is then constructed as the tangent at $X_1$, and the root of the new approximation is then found, and so on until the roots found for successive approximations converge to a desired precision.

The Newton Method can be written as the fixed point iteration $X=G(X)$ with $G(X)=X-F(X)/F'(X)$. This gives the iteration scheme $$X_1, X_2, X_3, \ldots$$

defined by $X_{n+1}=G(X_n)$, for $n=1, 2, 3, \ldots$, with $X_0$ given.

The iteration therefore is defined by $X_{n+1}=X_n-F(X_n)/F'(X_n).$

Returning to the m-dimensional case, the Newton method reads as follows:

$X_{n+1}=X_n-J^{-1}(X_n)F(X_n)$, $n=0, 1, \ldots$, with $X_0$ given, where the m by m matrix $$J(X) \equiv F'(X) = \begin{bmatrix} \frac{\partial F_1}{\partial x_1} & \ldots & \frac{\partial F_1}{\partial x_m} \\ & \ldots & \\ \frac{\partial F_m}{\partial x_1} & \ldots & \frac{\partial F_m}{\partial x_m} \end{bmatrix}$$

is sometimes called the Jacobian of F at point X. If this sequence converges then the limit is a solution of $X=G(X)$ and therefore also a solution of $F(X)=0$.

Assuming a close enough initial guess, in many cases convergence of the Newton Method is quadratic. The Newton Method is therefore an extremely valuable tool. But in some cases convergence is only linear or slower, and in some cases the method will never converge. In the situation where the Jacobian $F'(X_n)$ is not positive definite, the conventional Newton iteration from $X_n$ may not be in a descent direction. If the Jacobian is singular, then the iteration might not be computable at all.

Several modifications to Newton's Method to improve convergence behavior are known. In one known modification, a scaled identity matrix is added to the Jacobian to ensure that it is positive definite. A well-known member of this class of methods is the Levenberg-Marquardt method, in which a scalar multiple of the identity matrix is added to the symmetrized Jacobian, $(J^TJ+\mu I)^{-1}J^TF(X_n),$ thus shifting all the eigenvalues equally. This modification is computationally inexpensive for problems of relatively small size, but also sometimes fails to converge, for example where the addition of the identity matrix multiple is taken too small and in computer arithmetic still produces zeros on the diagonal.

A more sophisticated member of this class of methods is known as modified Cholesky factorization, where the shift in the Jacobian is calculated during factorization in such a way as to ensure that the resulting iteration step will lead to a decrease in the function value. See Stephen J. Wright, "Modified Cholesky factorizations in interior-point algorithms for linear programming," SIAM Journal on Optimization 9 (1999), pp. 1159-1191. This method may produce convergence in more situations, but is computationally much more expensive than either the basic Newton Method or the Levenberg-Marquardt method. In real world modeling of semiconductor devices, fabrication processes and analog circuits, the number of variables involved and the multiplicity of nodes at which the roots must be found usually render it prohibitive to incur the additional computational expense of the Levenberg-Marquardt or the modified Cholesky factorization methods.

Other modifications to the Newton Method are also known, but in general either they do not produce convergence in a sufficient number of cases, or where they do, they are too expensive computationally for use in real world modeling of semiconductor devices, fabrication processes and analog circuits. Accordingly, there is a need for an improved modification to the Newton Method which converges in difficult situations, and which does so without significant additional computational expense.

SUMMARY OF THE INVENTION

Roughly described, the invention involves adding a multiple of the diagonal to the Jacobian, rather than adding a multiple of the identity matrix. This modification is computationally less expensive than the modified Cholesky method, but tends to converge more quickly and in more situations than the conventional Newton method.

More particularly, the invention involves a method for numerically solving a system of equations of the form $$0=F(X),$$

for a solution vector X which involves choosing a starting guess $X_0$ and iterating $$X_{n+1}=X_n-[F'(X_n)+\sigma_n \mathrm{Diag} F'(X_n)]^{-1} F(X_n),$$

where Diag F'(X) denotes a diagonal of the matrix F'(X). In this iteration, at least one $\sigma n$ is a number greater than 0. More preferably, $$\sigma_n = \min\{\beta/n,\ [\alpha_n/(1+n\alpha_n)]\|F(X_n)\|\},$$

where $\beta$ is a constant that remains fixed for all n, and $$\alpha_n = \|F(X_n)\|/\|F(X_{n-1})\|.$$

The proposed method of finding the subsequent approximations of the solution $X_{n+1}$ along with the method of choosing the values of $\sigma_n$ are referred to in the following description as the Modified Newton method.

BRIEF DESCRIPTION OF THE DRAWINGS

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The invention will be described first by describing its use in three example problems from the fields of semiconductor device modeling, fabrication processes modeling, and analog circuit verification. An overall flow in one such field (as representative of all) will then be presented.

EXAMPLE 1

Figure 1:
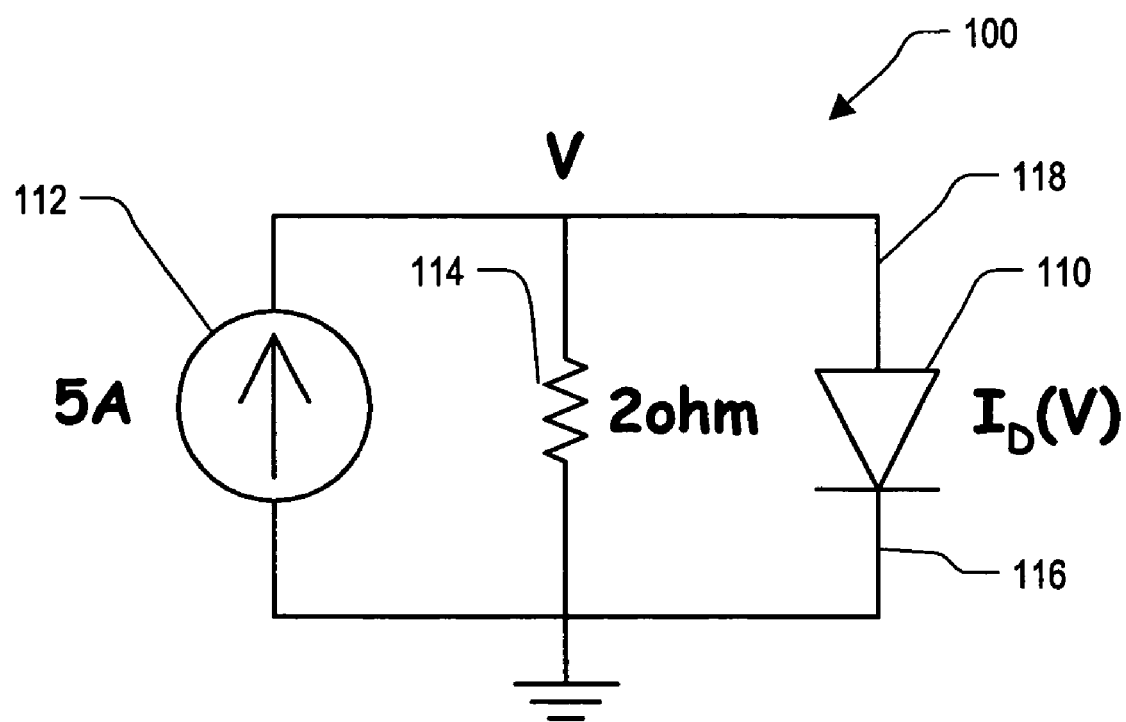
FIG. 1 is a schematic diagram of a nonlinear circuit used to describe a first example of the use of an aspect of the invention.

FIG. 1 illustrates a simple nonlinear circuit 100 that includes a diode 110, which is a nonlinear device. The cathode 116 of the diode is connected to ground and the diode is forward biased by a 5-amp constant current source 112 connected across it. A 2-ohm resistor 114 is also connected across the diode. It is desired to calculate the voltage V at the anode 118 of the diode 110.

An equation for diode junction current as a function of voltage has the form $$I_D=(1\text{ pA})\cdot[e^{40V}-1].$$

To find the unknown voltage V, the following nonlinear equation must be solved for V:

$$F(V)=-5+(V/2)+10^{-2}[e^{40V}-1]=0.$$

Using the conventional Newton Method, the derivative F'(V) is first determined symbolically as follows:

$$F'(V)=0.5+(4*10^{-11})e^{40V}$$

The following iteration is then set up:

$$V_{n+1}=V_n-F(V_n)/F'(V_n).$$

The iteration produces the solution, which rounded to 8 digits, is V*=0.72911881. However, convergence using the conventional Newton Method strongly depends on the initial guess for V. To improve this convergence behavior, and to reduce its dependency on the accuracy of the initial guess, a method according to the invention is used. Instead of the iteration above, the following iteration is used:

$$V_{n+1}=V_n-F(V_n)/[(1+\sigma_n)F'(V_n)]$$

Strategies for choosing $\sigma_n$ are described below, but for the present problem the following strategy can be used:

$$\sigma_n = \begin{cases} \|F(V_0)\|, \text{ for } n=0 \\ \min\left(\frac{5}{n},\ \frac{\alpha_n}{1+n\alpha_n}\|F(V_n)\|\right), \text{ for } n>0 \end{cases}$$

where $$\alpha_n = \frac{\|F(V_n)\|}{\|F(V_{n-1})\|}.$$

Here $\|F\|$ stands for a vector norm, which in this example is an absolute value of F ($\|F\|=|F|$).

Table I sets forth the number of iterations to convergence required by the conventional Newton Method, alongside the number of iterations to convergence required by the Newton Method as modified according to the above embodiment, for various starting values $V_0$. For the purposes of this comparison, convergence is considered attained when $|F(V_n)|<10^{-15}$. It can be seen that convergence is quicker using the modified method for all starting values listed, and the number of iterations required by the modified method is far less sensitive to the starting value than it is for the conventional method.

TABLE I

| Starting Value, $V_0$ | Iterations to convergence: Newton Method | Iterations to convergence: Modified Newton Method |
|---|---|---|
| 0.5 | 363 | 73 |
| 0.6 | 121 | 30 |
| 0.65 | 24 | 8 |
| 0.7 | 7 | 5 |

Note that in other embodiments, other markers can be used to identify an iteration endpoint. For example, instead of stopping when $|F(V_n)|$ is smaller than a predetermined number, an embodiment might stop when $|V_n-V_{n-1}|$ is smaller than a predetermined number, or when $\sigma_n$ is smaller than a predetermined number. Other possible markers will be apparent to the reader.

EXAMPLE 2

A second example will illustrate an extension of the above methods to a 2-dimensional case (and by further extension, to an m-dimensional case). In this example, which might be generated from a problem in the modeling of semiconductor devices, fabrication processes or analog circuits, suppose we wish to solve the following system of two nonlinear equations:

$$F(X) = \begin{pmatrix} x_1^2 + x_2^2 - 2 \\ e^{x_1-1} + x_2^3 - 2 \end{pmatrix} = 0.$$

This system has a solution $$X^* = \begin{pmatrix} 1 \\ 1 \end{pmatrix},$$

and we start from the initial guess $$X_0 = \begin{pmatrix} 2 \\ 0.5 \end{pmatrix}.$$

The classic Newton Method applied to this system diverges. In the classic Newton Method, the following iteration is performed:

$$X_{n+1}=X_n-J^{-1}(X_n)F(X_n),$$

where $$J(X_n)=F'(X_n).$$

After the first iteration step, the classic Newton Method yields (with rounding to 8 digits):

$$F(X_0) = \begin{pmatrix} 2.25 \\ 8.4328183e-01 \end{pmatrix},$$

$$J(X_0) = \begin{pmatrix} 4 & 1 \\ 2.7182818 & 0.75 \end{pmatrix},$$

$$J^{-1}(X_0) = \begin{pmatrix} 2.6622351 & -3.5496468 \\ -9.6489403 & 1.4198587e+01 \end{pmatrix},$$

$$U_0 = -J^{-1}(X_0)F(X_0) = \begin{pmatrix} -2.9966763 \\ 9.7367053 \end{pmatrix},$$

$$X_1 = X_0 + U_0 = \begin{pmatrix} -9.9667631E-01 \\ 1.0236705E+01 \end{pmatrix}.$$

The initial error prior to the first iteration was $$Z_0 = X^* - X_0 = \begin{pmatrix} -1 \\ -.5 \end{pmatrix},$$

which has a norm $$\|Z_0\|=7.9056942E-01.$$

After the first iteration, the norms of both the error and the residual are larger:

$$\|Z_1\| = \left\|\begin{pmatrix} 3.3237 \\ 9.236705 \end{pmatrix}\right\| = 6.6821943,$$

$$\|F(X_1)\| = \left\|\begin{pmatrix} 1.037835E+02 \\ 1.0708415E+03 \end{pmatrix}\right\| = 7.6074718E+02.$$

On the second iteration, the classic Newton iteration increases the norms of the errors and the residuals by a factor of more than 3000:

$$\|Z_2\| = 1.1382441E+01,$$

$$\|F(X_2)\| = \left\|\begin{pmatrix} 3.0078019E+02 \\ 3.2925071E+06 \end{pmatrix}\right\| = 2.3281541E+06.$$

After the second iteration, the residuals and errors slowly decrease until, after the 14'th iteration, they reach:

$$\|Z_{14}\| = 2.243894,$$

$$\|F(X_{14})\| = \left\|\begin{pmatrix} 1.8661403 \\ -1.9485914 \end{pmatrix}\right\| = 1.9078113.$$

These values are still larger than the initial error prior to the first iteration. But after the 15'th iteration, both the error and the residual jump dramatically:

$$\|Z_{15}\| = 2.2716195E+02,$$

$$\|F(X_{15})\| = \left\|\begin{pmatrix} 1.0382616E+05 \\ 3.3411786E+07 \end{pmatrix}\right\| = 2.3625815E+07.$$

The program can still compute a guess $X_{16}$ for the 16'th iteration, but the nonlinear residual $\|F(X_{16})\|$ goes to machine infinity (a number larger than the maximum that the computational system can handle). In particular, the program fails trying to compute the second component of $F(X_{16})$, $$F_2(X_{16}) = e^{(x_1-1)} + x_2^3 - 2.$$

Thus the conventional Newton Method is not adequate in this situation.

In order to solve the system, in an embodiment of the invention, a shift parameter $\sigma_n$ is chosen according to the following rules:

$$\sigma_n = \begin{cases} \min\{0.25, \|F(X_0)\|\}, & n=0 \\ \min\left\{\dfrac{0.25}{n}, \dfrac{\alpha_n}{1+n\alpha_n}\|F(X_n)\|\right\}, & n>0 \end{cases},$$

where $$\alpha_n = \frac{\|F(X_n)\|}{\|F(X_{n-1})\|}, n > 0.$$

The equation to be iterated is then:

$$X_{n+1} = X_n - J_\sigma^{-1}(X_n) F(X_n),$$

instead of $$X_{n+1} = X_n - J^{-1}(X_n) F(X_n)$$

as in the conventional method, where $$J_\sigma(X_n) = F'(X_n) + \sigma_n \mathrm{Diag} F'(X_n).$$

Another way to write the equation to be iterated is:

$$X_{n+1} = X_n + U_n,$$

where $U_n$ can be thought of as the n'th update, and is defined as:

$$U_n = -J_\sigma^{-1}(X_n) F(X_n).$$

In order to compare similar examples, we start the modified Newton iteration with the same initial guess, $$X_0 = \begin{pmatrix} 2 \\ 0.5 \end{pmatrix}.$$

For the first step of the modified iteration, we have:

$$F(X_0) = \begin{pmatrix} 2.25 \\ 8.4328183E-01 \end{pmatrix}.$$

We also have $\sigma_0 = 0.25$, since $0.25 < \|F(X_0)\| = 1.6990621$. We then have $$J_\sigma(X_0) = \begin{pmatrix} 4.25 & 1 \\ 2.7182818 & 1 \end{pmatrix},$$

$$J_\sigma^{-1}(X_0) = \begin{pmatrix} 4.7607726E-01 & -5.0781575E-01 \\ -1.3803863 & 2.5390787 \end{pmatrix},$$

$$U_0 = -J_\sigma^{-1}(X_0) F(X_0) = \begin{pmatrix} -6.4294205E-01 \\ 9.6471026E-01 \end{pmatrix},$$

$$X_1 = X_0 + U_0 = \begin{pmatrix} 1.3570579 \\ 1.4647103 \end{pmatrix}.$$

Thus the first modified iteration ends with a smaller error $$\|X^* - X_1\| = 4.1439474E-01,$$

compared to the larger first iteration error of 6.6821943 using the conventional method above. Similarly, the residual using the modified method, $$\|F(X_1)\| = 2.2978874,$$

is dramatically smaller than the residual of 7.60747718E+02 using the conventional method.

After the first step, the norms of both the error and residual decrease monotonically and convergence occurs rapidly. After the 6'th iteration, the modified method yields:

$$\sigma_6 = 9.2536E-08,$$

$$\|X^* - X_6\| = 1.5434223E-10,$$

$$\|F(X_6)\| = 3.8027083E-10.$$

The 7'th iteration gives the computationally exact solution:

$$X_7 = \begin{pmatrix} 1 \\ 1 \end{pmatrix},$$

$$\sigma_7 = 6.3651E-15,$$

$$\|X^* - X_7\| = \|F(X_7)\| = 0.$$

Figure 2:
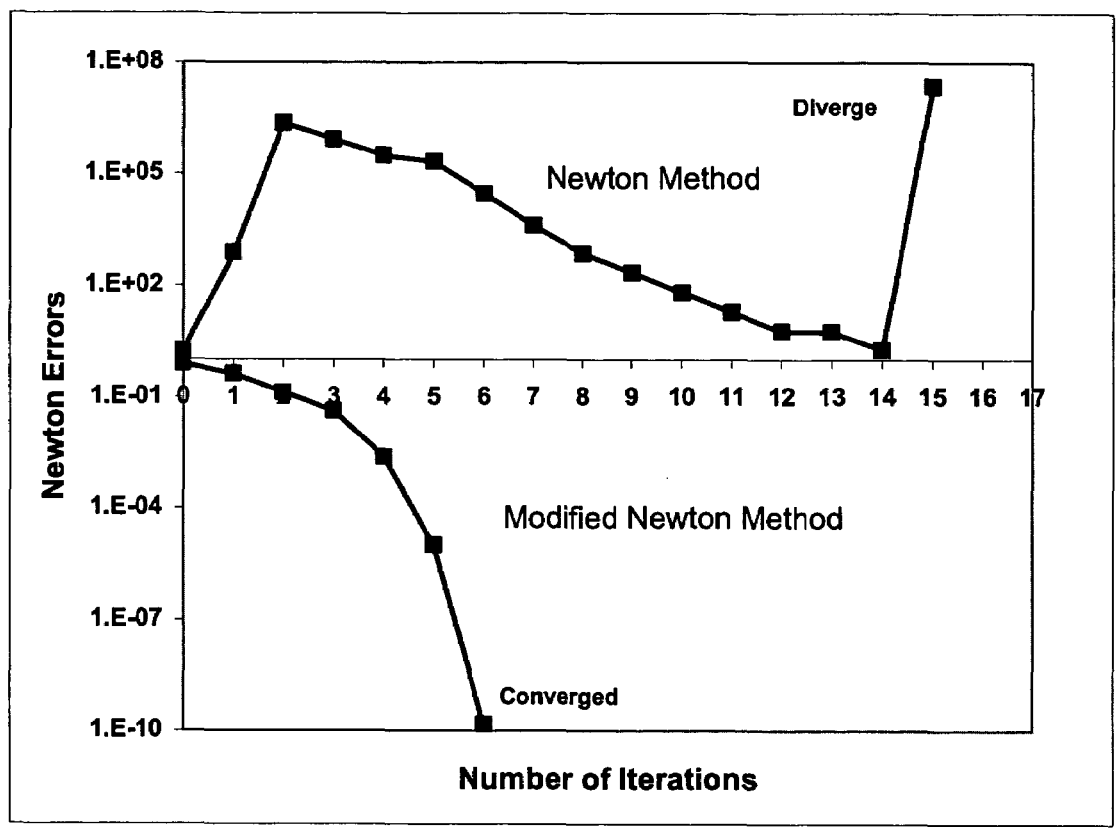
FIG. 2 illustrates the norms of the errors of the conventional Newton Method and of the modified Newton Method, for a second example of the use of an aspect of the invention.
Figure 3:
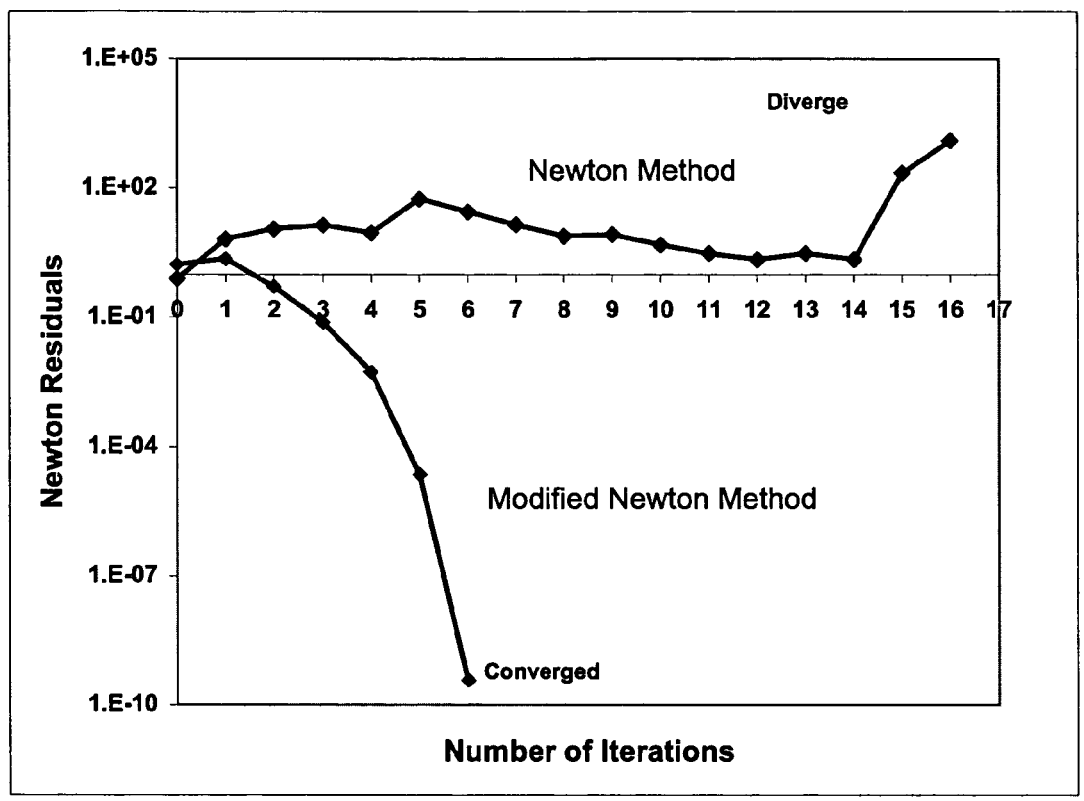
FIG. 3 illustrates the norms of the residuals of the conventional Newton Method and of the modified Newton Method, for the second example of the use of an aspect of the invention.

FIG. 2 illustrates the norms of the errors of the conventional Newton Method and of the modified Newton Method described herein. It can be seen that the conventional Newton iteration diverges in the situation of this example whereas the modified Newton iteration converges. Similarly, FIG. 3 illustrates the norms of the residuals of the conventional Newton Method and of the modified Newton Method. Again it can be seen that the conventional Newton iteration diverges in the situation of this example whereas the modified Newton iteration converges.

EXAMPLE 3

In the fields of atomic transport (in process simulation) and electronic transport (in device simulation), typically a 3-dimensional mesh is imposed on the volume to be simulated. At each node of the mesh, a continuity equation is defined which describes the change in concentration of the species under study after one time increment, assuming known starting concentrations at that node and at nearby nodes. The term "species" is intended to be interpreted broadly as used herein, to include particles as well as characteristics. In the field of process simulation, the "species" under study might include, for example, impurity particles, self-interstitials and vacancies. The continuity equations for such species might be based on the law of conservation of mass. In the field of device modeling, the "species" under study might include, for example, carrier particles (such as electrons and holes) and heat. The continuity equations for such species might be based on the law of conservation of mass, Poisson's equation, lattice heat transfer equations, or energy balance equations.

The continuity equations thereby define a system of functions in the form $$F(X^\tau) = 0,$$

for time increment $\tau$, where $X^\tau$ contains the concentrations of the species at all the nodes after time increment $\tau$, and the known starting concentrations $X^0$ are incorporated into the functions as constants. A solution $X^\tau$ is then found using a numerical technique such as the Newton Method, and the values of $X^\tau$ are then taken as the starting concentrations for a new system of functions, $F(X^{2\tau})$. These functions will differ from $F(X^\tau)$, because the "starting" concentrations which appear as constants in the functions will have values from $X^\tau$ rather than from $X^0$. The system $$F(X^{2\tau}) = 0$$

is then solved for $X^{2\tau}$ using another execution of the numerical technique. The process continues iteratively for a fixed number of temporal iterations or until the new set of concentrations are negligibly different from the immediately prior set of concentrations.

The continuity equations are derived from fundamental laws, while terms and parameters within the continuity equations usually derive from physical theory or empirical information. In real life systems, since the accuracy of the simulation improves as the mesh becomes finer, the number of nodes (and hence the number of elements in $X^\tau$) may be very large (in the thousands for 2-dimensional meshes and in the millions for 3-dimensional meshes). Also in many real life systems, the concentrations of more than one species interact with each other over time. If such interactions are to be modeled in the equations, then number of variables in $X^\tau$ can grow even larger, by an order of magnitude or more. Still further, since accuracy also improves as the time increment between temporal iterations is made shorter, the number of times the system of equations must be solved can also become very large. It can be seen that these factors place a premium on rapid convergence of the system at each time increment.

In order to illustrate embodiments of the invention for simulating atomic transport or electronic transport, a 1-dimensional simplified example will be assumed. The reader will understand how the methods described herein can be extrapolated for use in real life systems.

The continuity equation is based on conservation of mass and has the following form:

$$\frac{d}{dt}\int_{V(t)} C\,dV = \int_{V(t)} [g-l]\,dV - \oint_{S(t)} \vec{\Phi}\vec{n}\,dS,$$

where t is time; C is the concentration of the species (either atoms or electrons/holes); V(t) is the volume being considered (which can change over time); g is the generation of the species; l is the recombination of the species; S(t) is the area of the surface that encompasses the volume V(t); $\vec{\Phi}$ is the flux of the species across the surface S(t); and $\vec{n}$ is the outward facing normal to the surface S(t).

Figure 4:
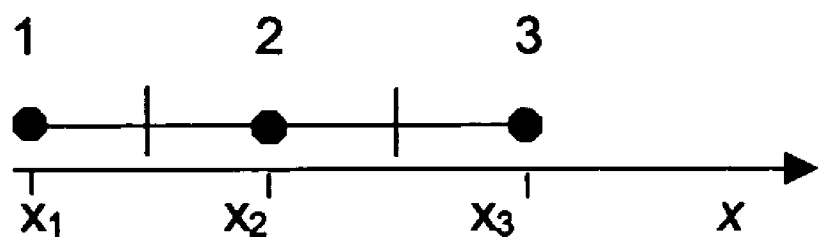
FIG. 4 illustrates a 1-dimensional mesh containing three nodes, used in describing a third example of the use of an aspect of the invention.

In order to keep the illustration simple, a 1-dimensional mesh containing only 3 nodes, all along the x axis, will be assumed. FIG. 4 illustrates the mesh. The nodes are disposed at positions $x_1$, $x_2$ and $x_3$. In addition, other simplifying assumptions are made as follows:

- The generation and recombination terms are negligible (g=l=0);
- The flux is purely diffusional $$\left(\vec{\Phi}(x) = -D\frac{dC(x)}{dx}\right);$$

Figure 5:
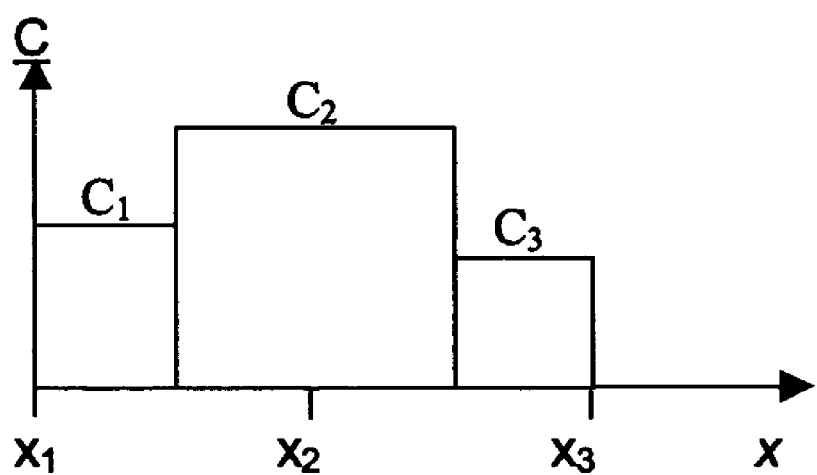
FIG. 5 illustrates species concentrations at a point in time along the x axis relative to the node positions of FIG. 4.

- Each node i has a piece-wise constant impurity concentration $c_i$ associated with it for the appropriate Voronoi volume. FIG. 5 illustrates the concentrations at one point in time along the x axis relative to the node positions;
- The boundary conditions at the left and right sides of the simulation domain (at nodes 1 and 3, respectively) are such that there is zero flux, which means reflective boundary conditions;
- The mesh spacing is uniform ($x_2-x_1=x_3-x_2\equiv\Delta x$);
- Diffusivities of the impurities are functions of the local concentration: D(C).

With these simplifying assumptions, a discretized form of the mass conservation equation above for each mesh node is:

$$\frac{d}{dt}\int_a^b C\,dx + [\Phi(b) - \Phi(a)] = 0, \; t > 0.$$

Considering the piece-wise approximation of the impurity concentration, the integration limits a and b for the three mesh nodes are as follows:

| | | |
|---|---|---|
| For the 1st mesh node: | $a = x_1 = 0$ | $b = (x_2 + x_1)/2 = \Delta x/2$ |
| For the 2nd mesh node: | $a = (x_2 + x_1)/2 = \Delta x/2$ | $b = (x_3 + x_2)/2 = (3/2)\Delta x$ |
| For the 3rd mesh node: | $a = (x_3 + x_2)/2 = (3/2)\Delta x$ | $b = x_3 = 2\Delta x$ |

The diffusion fluxes in between the nodes can be written as:

$$\Phi(x_1) = 0$$
$$\Phi(x_{1.5}) = -D(x_{1.5})\frac{c_2 - c_1}{x_2 - x_1}$$
$$\Phi(x_{2.5}) = -D(x_{2.5})\frac{c_3 - c_2}{x_3 - x_2}$$
$$\Phi(x_3) = 0$$

where $D(x)$ is the scalar impurity diffusivity of the species under study at position x, and more specifically, $$D(x_{1.5}) = D\left(\frac{c_2 + c_1}{2}\right) \text{ and }$$
$$D(x_{2.5}) = D\left(\frac{c_3 + c_2}{2}\right).$$

To see the evolution of the concentrations over time, we wish to find the concentrations after a temporal iteration from a starting time t=0 to an ending time t=τ. Integrating the above discretized form of the mass conservation equation using the Implicit Euler scheme, we obtain:

$$\left[\int_a^b C dx\right]^\tau - \left[\int_a^b C dx\right]^0 + \tau[\Phi(b) - \Phi(a)]^\tau = 0,$$

where $[\Phi]^\tau$ denotes function $\Phi$ at time t=τ. Then the mass conservation equations for the three mesh nodes can be written as:

$$\left[\frac{\Delta x}{2} + \frac{\tau}{\Delta x}D\left(\frac{c_1^\tau + c_2^\tau}{2}\right)\right]c_1^\tau - \frac{\tau}{\Delta x}D\left(\frac{c_1^\tau + c_2^\tau}{2}\right)c_2^\tau + 0c_3^\tau - \frac{\Delta x}{2}c_1^0 = 0,$$

$$-\frac{\tau}{\Delta x}D\left(\frac{c_1^\tau + c_2^\tau}{2}\right)c_1^\tau + \left[\Delta x + \frac{\tau}{\Delta x}D\left(\frac{c_1^\tau + c_2^\tau}{2}\right) + \frac{\tau}{\Delta x}D\left(\frac{c_2^\tau + c_3^\tau}{2}\right)\right]c_2^\tau -$$
$$\frac{\tau}{\Delta x}D\left(\frac{c_2^\tau + c_3^\tau}{2}\right)c_3^\tau - \Delta x\, c_2^0 = 0,$$

$$0c_1^\tau - \frac{\tau}{\Delta x}D\left(\frac{c_2^\tau + c_3^\tau}{2}\right)c_2^\tau + \left[\frac{\Delta x}{2} + \frac{\tau}{\Delta x}D\left(\frac{c_2^\tau + c_3^\tau}{2}\right)\right]c_3^\tau - \frac{\Delta x}{2}c_3^0 = 0,$$

where $c_i^n$ denotes the impurity concentration at the i'th node for the k'th point in time. The concentrations $c_i^n$ at time t=0 are the known initial conditions, and the concentrations $c_i^n$ at time τ are the unknown concentrations (unknowns) that are to be determined.

Typically, impurity diffusivity can be expressed as:

$$D(C) = D_0 + D_+ C,$$

where $D_0$ is the diffusivity via neutral species and $D_+$ is the diffusivity via positively charged species. Substituting this diffusivity into the above system of mass conservation equations for the three mesh nodes and denoting $$\eta_0 = \frac{\tau}{\Delta x^2}, \eta_+ = \frac{\tau}{\Delta x^2}\frac{D_+}{2},$$

we arrive at:

$$\left[\frac{1}{2}c_1^\tau + \eta_0 c_1^\tau + \eta_+ (c_1^\tau)^2\right] - [\eta_0 c_2^\tau + \eta_+ (c_2^\tau)^2] - \frac{1}{2}c_1^0 = 0,$$

$$-[\eta_0 c_1^\tau + \eta_+ (c_1^\tau)^2] + [c_2^\tau + 2\eta_0 c_2^\tau + 2\eta_+ (c_2^\tau)^2] -$$
$$[\eta_0 c_3^\tau + \eta_+ (c_3^\tau)^2] - c_2^0 = 0,$$

$$-[\eta_0 c_2^\tau + \eta_+ (c_2^\tau)^2] + \left[\frac{1}{2}c_3^\tau + \eta_0 c_3^\tau + \eta_+ (c_3^\tau)^2\right] - \frac{1}{2}c_3^0 = 0.$$

These three equations constitute a nonlinear system of equations of the form $$F(C) = F(c_1, c_2, c_3) = \begin{pmatrix} F_1(c_1, c_2, c_3) \\ F_2(c_1, c_2, c_3) \\ F_3(c_1, c_2, c_3) \end{pmatrix} = 0.$$

There are three unknowns $c_1 = c_1^\tau$, $c_2 = c_2^\tau$ and $c_3 = c_3^\tau$ to be determined at each time step.

This nonlinear system of equations can be solved at each time step by applying a Newton iteration with the following steps:

1. Set the initial guess $^0C = (c_1^0, c_2^0, c_3^0)$. For this first time step, various techniques can be used to set the initial guess. For subsequent time steps the solution from the previous time step can be used as the initial guess. In other embodiments, more sophisticated algorithms can be used to set the initial guess for the subsequent time steps.
2. Compute the initial residual $F(^0C)$ at point $^0C$;
3. Iterate until convergence is achieved: For n=0, 1, 2, . . . do:
    a. compute a Jacobian matrix $J = F'(^nC)$
    b. solve the linear system $JU = -F$ to find an update vector U;
    c. compute a new estimate of the unknowns $^{n+1}C = {}^nC + U$;
    d. evaluate whether convergence has been achieved, and if not, perform next iteration.

The Jacobian computed above is a 3×3 matrix of the form:

$$J = F'(c_1, c_2, c_3) = \begin{pmatrix} \frac{\partial F_1}{\partial c_1} & \frac{\partial F_1}{\partial c_2} & \frac{\partial F_1}{\partial c_3} \\ \frac{\partial F_2}{\partial c_1} & \frac{\partial F_2}{\partial c_2} & \frac{\partial F_2}{\partial c_3} \\ \frac{\partial F_3}{\partial c_1} & \frac{\partial F_3}{\partial c_2} & \frac{\partial F_3}{\partial c_3} \end{pmatrix} =$$

$$\begin{pmatrix} \frac{1}{2} + \eta_0 + 2\eta_+ c_1 & -(\eta_0 + 2\eta_+ c_2) & 0 \\ -(\eta_0 + 2\eta_+ c_1) & 1 + 2\eta_0 + 4\eta_+ c_2 & -(\eta_0 + 2\eta_+ c_3) \\ 0 & -(\eta_0 + 2\eta_+ c_2) & \frac{1}{2} + \eta_0 + 2\eta_+ c_3 \end{pmatrix}.$$

In the modified Newton Method, a shift parameter $^n\sigma$ is computed and the Jacobian is modified by multiplying its diagonal terms by the factor $(1+{}^n\sigma)$. For this example, therefore, the modified Jacobian matrix $J_\sigma$ has the form:

$$J_\sigma = J + \sigma DiagJ = \begin{pmatrix} (1+\sigma)\frac{\partial F_1}{\partial c_1} & \frac{\partial F_1}{\partial c_2} & \frac{\partial F_1}{\partial c_3} \\ \frac{\partial F_2}{\partial c_1} & (1+\sigma)\frac{\partial F_2}{\partial c_2} & \frac{\partial F_2}{\partial c_3} \\ \frac{\partial F_3}{\partial c_1} & \frac{\partial F_3}{\partial c_2} & (1+\sigma)\frac{\partial F_3}{\partial c_3} \end{pmatrix} =$$

$$\begin{pmatrix} (1+\sigma)\left(\frac{1}{2}+\eta_0+2\eta_+\right) & -(\eta_0+2\eta_+c_2) & 0 \\ -(\eta_0+2\eta_+c_1) & (1+\sigma)(1+2\eta_0+4\eta_+) & -(\eta_0+2\eta_+c_3) \\ 0 & -(\eta_0+2\eta_+c_2) & (1+\sigma)\left(\frac{1}{2}+\eta_0+2\eta_+\right) \end{pmatrix}$$

The modified method will converge on a solution at each time step more quickly or more reliably than will the conventional Newton Method. The method is then repeated for the next time step, and so on for as many time steps as desired.

Figure 6:
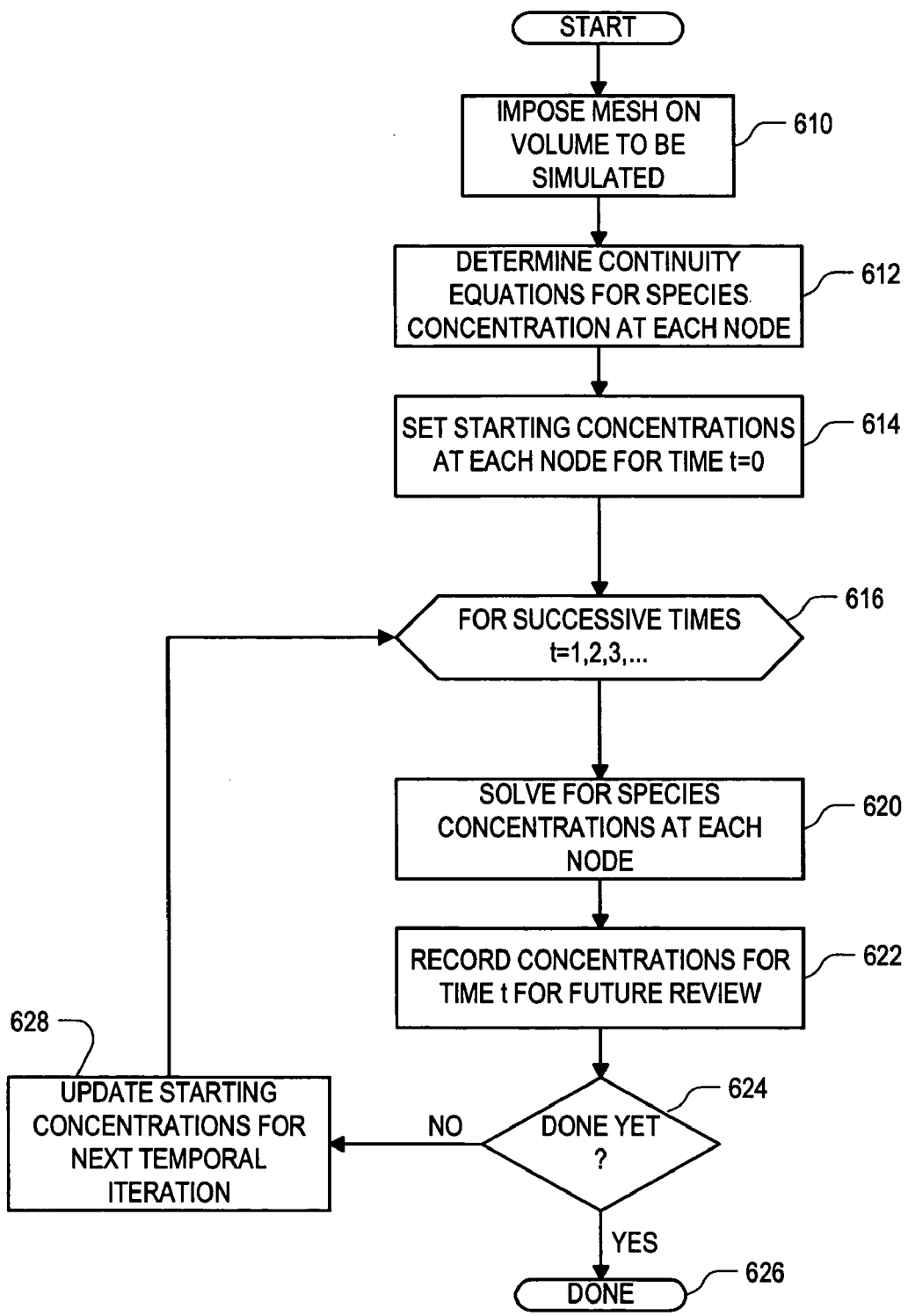
FIG. 6 is a flow chart illustrating overall flow of a method for numerically solving a system of equations, incorporating features of the invention.

FIG. 6 is an overall flow chart illustrating the overall flow of the process or device simulation example. As with all flow charts herein, it will be appreciated that many of the steps can be combined, performed in parallel or performed in a different sequence without affecting the functions achieved. Referring to FIG. 6, in step 610, a mesh is first imposed on the volume to be simulated. Typically this step is performed by the simulation system based on volume boundaries and other parameters supplied by the user. As mentioned, the finer the mesh chosen by the user, the more accurate the results will likely be, but the more time will be required to perform all the required calculations. In one embodiment, the user can set different node spacings in different parts of the volume under study.

In step 612, the continuity equations are developed for species concentrations at each node of the mesh. These, too, may be entered by the user in symbolic form into the simulation system. As mentioned, these equations may be based on theoretical or empirical information, and describe the temporal change in species concentration at a given node as a function of the current concentration at the given node, and at other nodes, of the species under study as well as other species if appropriate. These equations are typically non-linear, and cannot be solved in closed form for the new concentrations as functions of the prior concentrations. For facilitating subsequent steps, the equations are written in matrix form, $F(X)=0.$ The Jacobian matrix $F'(X)$, used in both the conventional and modified Newton Methods, may be determined at this step as well. In one embodiment they are derived manually by the user and entered into the system symbolically, and in another embodiment the system derives them automatically and symbolically from the equations $F(X)$.

In step 614, in preparation for the temporal iteration, the user supplies starting concentrations at all nodes for the species under study. For an impurity diffusion step in a semiconductor fabrication process, for example, the starting concentrations might be set according to the as-implanted profile as a result of an ion implantation step. Then, in step 616, the system begins a loop for iterating the species concentrations in the volume for successive discrete time increments t=1, 2, 3, . . . . The time increment for each iteration can be made selectable by the user in certain embodiments, and as mentioned, shorter time increments will usually produce more accurate results at the expense of increased overall time required to complete the simulation. The time increments in one embodiment are required to be of fixed duration whereas in another embodiment they can vary from time step to time step.

In step 620, the simulation system solves the system of equations for the species concentrations at each node at time t. In the present embodiment, the modified Newton Method is used to find this solution, as described further below with respect to FIG. 7.

If the purpose of the simulation includes predicting how the concentrations change over time, then in step 622, the current concentrations calculated for time t are recorded at this time for future review. If the purpose is only to predict the species concentrations at a temporal endpoint, for example at equilibrium, then this step may be omitted.

In step 624, the simulation system determines whether all temporal iterations have been completed. If the user requested a fixed number of iterations, T for example, then step 624 includes a step of comparing t to the user's requested number T. If the iterations are to complete until equilibrium is achieved, for example, then step 624 might include a comparison of the species concentrations predicted for time t to those that were calculated previously for time t−1. Other termination conditions will be apparent to the reader.

If the termination condition of step 624 is satisfied, then the simulation completes (step 626) and the results may be made available for review by the user. If not, then in step 628, the simulation system updates the starting concentrations at each node in preparation for the next temporal iteration. In the present embodiment, this update involves merely copying the predicted species concentration values for time t into the starting concentration values for iteration t+1. The simulation then continues at step 616 for the next temporal iteration.

Figure 7:
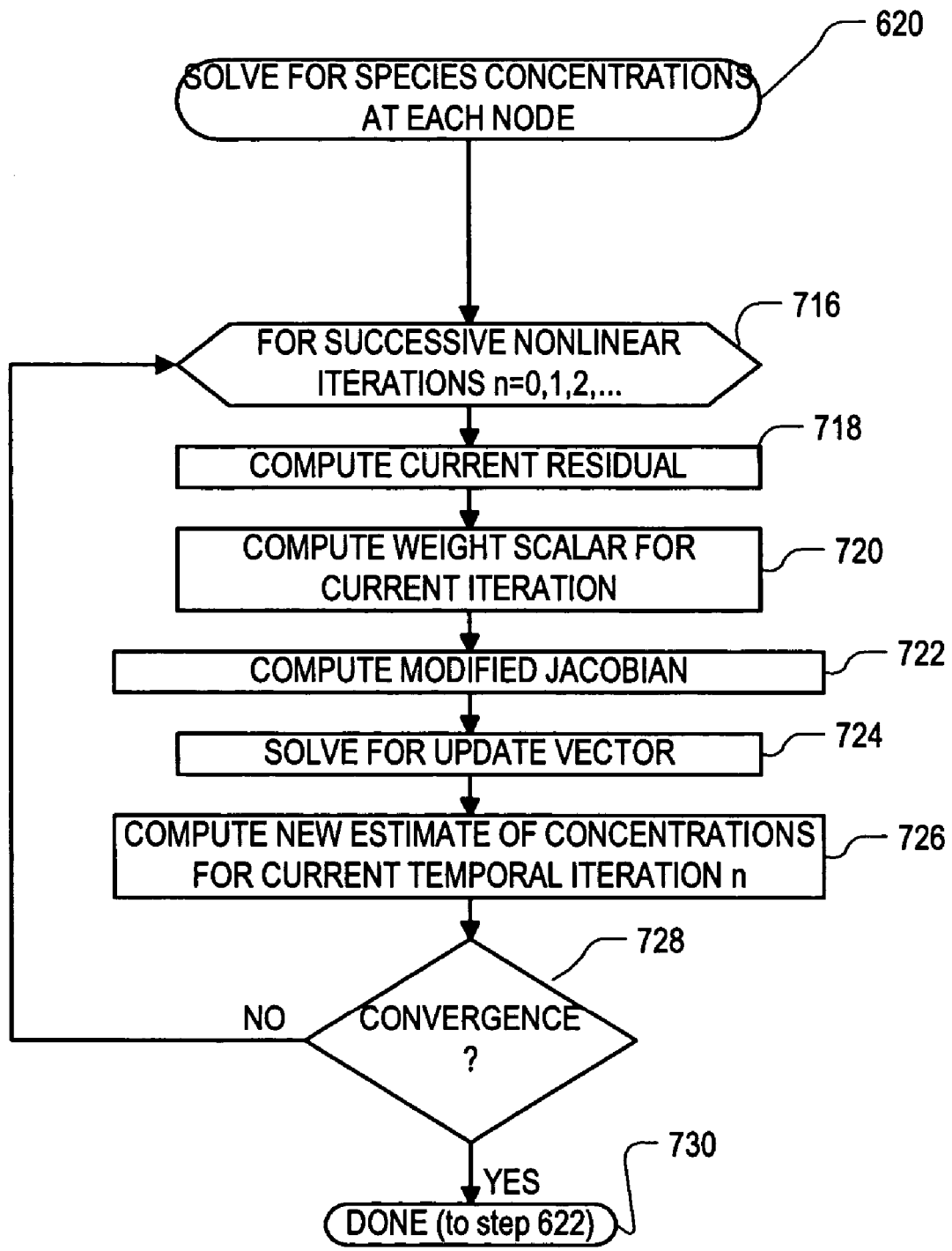
FIG. 7 is a flowchart detail of step 620 in FIG. 6.

FIG. 7 is a flowchart detail of step 620 (FIG. 6), in which a method according to the invention may be used to solve numerically for the species concentrations at each node for the current time step. Prior to step 716, the simulation system already has an initial guess ${}^0C^t$ for the species concentration at each node for time t (i.e. for after the current time step). In step 716, the system begins a loop for successive iterations n. This loop is nested inside the temporal iteration loop in FIG. 6.

In step 718, the system computes the current residual, $F({}^0C^t)$. In step 720, the system computes a shift parameter ${}^n\sigma$ for the current iteration n. In the embodiment of Example 3, a rule similar to the one used in Examples 1 or 2 can be used to compute each ${}^n\sigma$ In step 722, the shift parameter ${}^n\sigma$ is used to compute the modified Jacobian matrix $J_\sigma$. This step can take advantage of the determination in step 612 (FIG. 6) of the derivatives of the continuity equations. In step 724 the current update vector ND is computed, for example by inverting the modified Jacobian and multiplying the result by the negative of the current residual $F({}^nC^t)$. Then in step 726, the system computes the new estimate ${}^{n+1}C^t$ of concentrations for the current temporal iteration t, from ${}^{n+1}C^t = {}^nC^t + {}^nU.$ In step 728, the simulation system determines whether convergence has been achieved. Various embodiments can employ various tests to determine convergence. In one embodiment, convergence is considered achieved when the norm of the differences between the species concentrations estimated in the current iteration and those estimated in the immediately prior iteration is less than a predetermined number ($\|^{n+1}C^t - {}^nC^t\| <$ predetermined number). In another embodiment, convergence is considered achieved when the norm of the residual is less than a predetermined number ($\|F(^{n+1}C^t)\| <$ predetermined number). If it is determined that convergence has been achieved, then in step 730, the system returns to the flow of FIG. 6 for evaluating whether additional temporal iterations are desired. If not, then the system loops back to step 716 for the next Modified Newton iteration in the current time step t.

Choosing a Shift Parameter

A variety of strategies can be used to choose the shift parameters $\sigma_n$ for use with the modified Newton Method, and different problems may require different rules for choosing them. However, a number of considerations provide some useful guidelines for an appropriate rule.

Initially, note that the shift parameters $\sigma_n$ used in the modified method define the distinction between the modified method and the conventional Newton Method. That is, only if $\sigma_n$ is non-zero is the modified method any different from the conventional Newton Method for the n'th iteration. Since the convergence properties of the conventional Newton Method are usually very good when the current approximation is close to the solution, it is preferred that the conventional Newton Method be modified less and less as the solution is approached. Therefore, it is preferable that the rule used to calculate the shift parameters $\sigma_n$ be such that $\sigma_n$ approaches zero as the norm of the residual approaches zero. With all other variables constant, the approach of $\sigma_n$ to zero should be at least as fast as the nonlinear residuals $F(X_n)$ tend to zero. More particularly, it is preferred that there be a proportionality of the n'th shift parameter to the norm of the n'th residual (an roughly proportional to $\|F(X_n)\|$). This same consideration also suggests that preferably, the shift parameter should approach zero as the iteration count n increases. More particularly, there should be an inverse proportionality to the iteration count ($\sigma_n$ roughly proportional to 1/n).

Second, it has been found that under some conditions on the Jacobian, better convergence behavior is achieved when the update sizes are reduced relative to the conventional Newton Method. Since a negative shift parameter will increase rather than reduce the size of the update, the rule for calculating the shift parameters $\sigma_n$ should ensure that they always remain non-negative ($\sigma_n >= 0$ for all n).

Third, if the norm of the residual is increasing iteration-to-iteration, rather than decreasing, it is likely that the update sizes need to be reduced more quickly. Therefore, it is preferable that the shift parameter have a proportionality to a ratio of the norms of the residuals iteration-to-iteration ($\sigma_n$ roughly proportional to $\|F(X_n)\|/\|F(X_{n-1})\|$, n>1).

Finally, since another goal is rapid convergence, it is further desirable that the shift parameters not be allowed to become too large. Increasing shift parameters is also an indication that the iteration is diverging rather than converging, suggesting again that the update size needs to be reduced. One way of preventing the shift parameters from becoming too large is to enforce an upper bound on them, for example a positive constant $\beta$ divided by the iteration number. In Example 1 above, the upper bound is $5/n$ ($\beta=5$), whereas in Example 2 above the upper bound is $0.25/n$ ($\beta=0.25$). The selection of $\beta$ will depend on the particular problem to be solved.

The above considerations are satisfied by the rules used in the examples above for calculating the shift parameters. In general, the shift parameters are preferably given by:

$$\sigma_n = \min\{\beta/n, [\alpha_n/(1+n\alpha_n)] \|F(X_n)\|\}, n>0$$

where $\alpha_n = \|F(X_n)\|/\|F(X_{n-1})\|$ and $\beta$ might be a problem-dependent constant. In the first example above, $\beta=5$, whereas in the second example, $\beta=0.25$. The initial value for $\sigma_n$ (i.e. for $\sigma_0$) is preferably equal to the initial residual, $\|F(X_0)\|$ (as in Example 1), or in another embodiment it may be equal to the minimum of $\beta$ and $\|F(X_0)\|$ (as in Example 2). Other forms of shift parameter rules meeting some or all of the above considerations will be apparent to the reader.

Ensuring Reduced Update Size

As mentioned, it is preferred that the update size be reduced compared to the conventional Newton Method for at least some of the updates. Under certain conditions on the Jacobian $F'(X_n)$, it can be proved that a positive value of the shift parameter $\sigma_n$ will produce an update $U_n$ having a lower norm than $U_n$ using the conventional Newton Method.

We begin with a more generalized theorem.

Theorem. Let D be a Hermitian positive definite matrix $$D = D^H > 0,$$

and let $$\frac{\sigma}{2}D + A$$

be a positive definite matrix for a given positive $\sigma$ $$\frac{\sigma}{2}D + A > 0, \sigma > 0.$$

If y is the solution of the equation $$Ay = b,$$

and $y_\sigma$ is the solution of the equation $$(\sigma D + A)y_\sigma = b,$$

then the D norm for the vector $y_\sigma$ is smaller than for the vector y:

$$\sqrt{(Dy_\sigma, y_\sigma)} < \sqrt{(Dy, y)}.$$

Proof. We rewrite these two equations in the following form:

$$-\frac{\sigma}{2}Dy + \left(\frac{\sigma}{2}D + A\right)y = b,$$

$$\frac{\sigma}{2}Dy_\sigma + \left(\frac{\sigma}{2}D + A\right)y_\sigma = b.$$

Subtracting the first equation from the second yields $$\frac{\sigma}{2}D(y_\sigma + y) + \left(\frac{\sigma}{2}D + A\right)(y_\sigma - y) = 0.$$

Multiplying by $(y_\sigma - y)^H$ yields the following equation for inner products:

$$\frac{\sigma}{2}(D(y_\sigma + y), y_\sigma - y) + \left(\left(\frac{\sigma}{2}D + A\right)(y_\sigma - y), y_\sigma - y\right) = 0.$$

Using the fact that the matrix $$\frac{\sigma}{2}D + A$$

is positive definite, i.e. an inner product $$\left(\left(\frac{\sigma}{2}D + A\right)(y_\sigma - y), y_\sigma - y\right) > 0$$

is positive for any nonzero vector $y_\sigma - y$, we arrive at $$\frac{\sigma}{2}(Dy_\sigma, y_\sigma) = \frac{\sigma}{2}(Dy, y) - \left(\left(\frac{\sigma}{2}D + A\right)(y_\sigma - y), y_\sigma - y\right) < \frac{\sigma}{2}(Dy, y),$$

and finally obtain $(Dy_\sigma, y_\sigma) < (Dy, y).$

Having proved the theorem, it can now be applied to the modified Newton Method by substituting as follows:
D in the theorem is the diagonal part of the Jacobian matrix $F'(X_n)$ at point $X_n$:

$D = DiagF'(X_n);$

A in the theorem is the Jacobian matrix $F'(X_n)$ itself, taken at point $X_n$;
b in the theorem is the nonlinear residual itself $F(X_n)$, computed at point $X_n$;
y is the update (for the modified Newton method it will be $y_\sigma$);
and the inner product (Dy, y) in the real-valued case is $$(Dy, y) = \sum_{i=1}^{m}(D_i y_i^2),$$

where m is the number of unknowns and $y_i$ is the i'th component of the solution vector (of the update).

Note that since we consider diagonal matrices D it is easy to establish that D is positive definite if and only if all $D_i$ are positive, i.e. if and only if the Jacobian matrix has positive entries on the diagonal.

It now can be seen that according to the theorem, on step n at point $X_n$, if:
the entries on the diagonal of the Jacobian matrix $F'(X_n)$ (are all positive; and
$\sigma_n$ is positive; and
the shifted Jacobian matrix $$\frac{\sigma_n}{2}DiagF'(X_n) + F'(X_n)$$

is positive definite, then the update vector according to the modified Newton method will necessarily have a smaller D-norm than the update vector according to conventional Newton method.

Thus in the situation where the entries on the diagonal of the Jacobian matrix $F'(X_n)$ (are all positive, it is possible to ensure a smaller n'th update vector by choosing or $\sigma_n > 0$ and such that the shifted Jacobian matrix is positive definite.

System Hardware Environment

Figure 8:
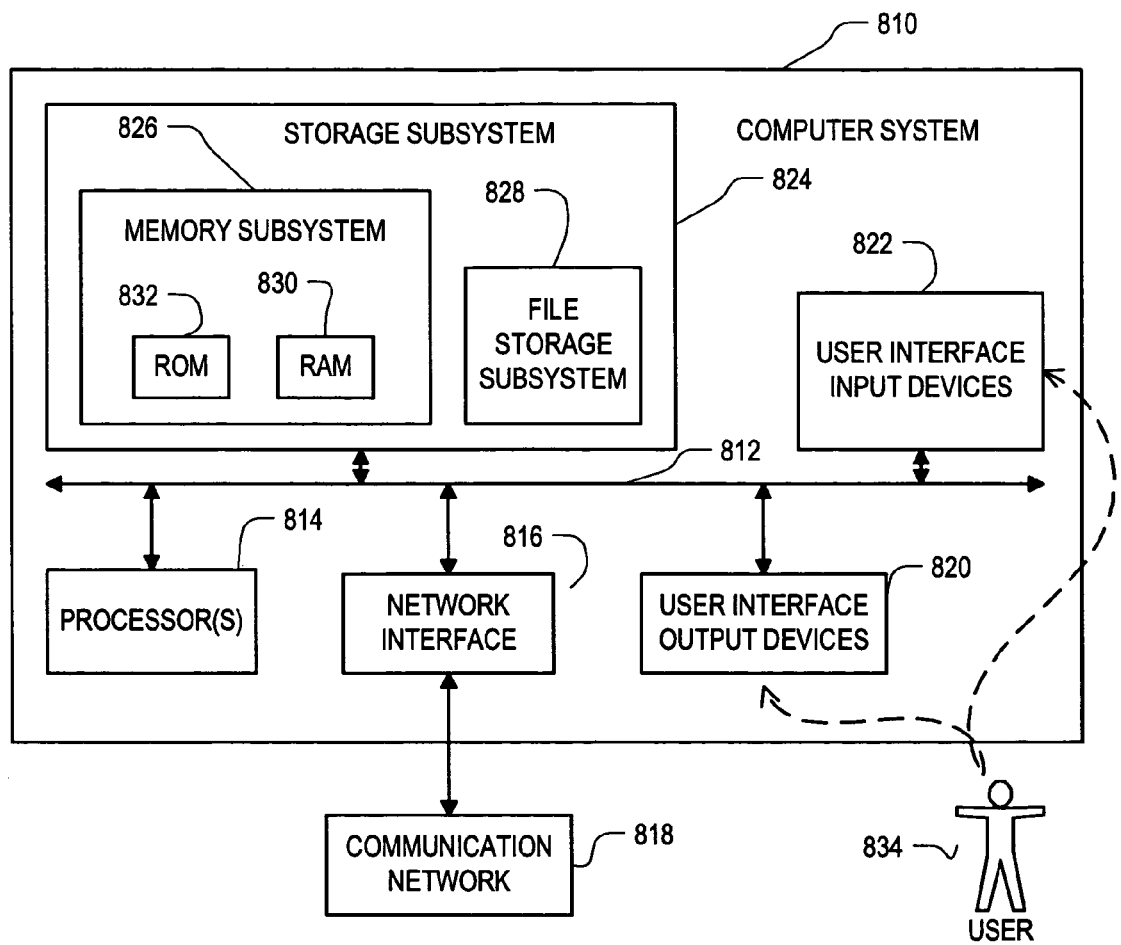
FIG. 8 is a simplified block diagram of a platform that can be used to implement a method incorporating the invention.

FIG. 8 is a simplified block diagram of a computer system 810 suitable for use with embodiments of the present invention. Computer system 810 typically includes at least one processor 814 which communicates with a number of peripheral devices via bus subsystem 812. These peripheral devices may include a storage subsystem 824, comprising a memory subsystem 826 and a file storage subsystem 828, user interface input devices 822, user interface output devices 820, and a network interface subsystem 816. The input and output devices allow user interaction with computer system 810. For example, a user 834 can supply parameters to the system via one of the user interface input devices 822, and the system can report solutions to the user 834 via one of the user interface output devices 820. The network interface subsystem 816 provides an interface to outside networks, including an interface to communication network 818, and is coupled via communication network 818 to corresponding interface devices in other computer systems. Communication network 818 may comprise many interconnected computer systems and communication links. These communication links may be wireline links, optical links, wireless links, or any other mechanisms for communication of information. While in one embodiment, communication network 818 is the Internet, in other embodiments, communication network 818 may be any suitable computer network.

User interface input devices 822 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 810 or onto computer network 818.

User interface output devices 820 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 810 to the user or to another machine or computer system.

Storage subsystem 824 stores the basic programming and data constructs that provide the functionality of certain embodiments of the present invention. For example, the various modules implementing the functionality of certain embodiments of the invention may be stored in storage subsystem 824. These software modules are generally executed by processor 814.

Memory subsystem 826 typically includes a number of memories including a main random access memory (RAM) 830 for storage of instructions and data during program execution and a read only memory (ROM) 832 in which fixed instructions are stored. File storage subsystem 828 provides persistent storage for program and data files, and may include a hard disk drive, a floppy disk drive along with associated removable media, a CD-ROM drive, an optical drive, or removable media cartridges. The databases and modules implementing the functionality of certain embodiments of the invention may be stored by file storage subsystem 828.

Bus subsystem 812 provides a mechanism for letting the various components and subsystems of computer system 810 communicate with each other as intended. Although bus subsystem 812 is shown schematically as a single bus, alternative embodiments of the bus subsystem may use multiple busses.

Computer system 810 itself can be of varying types including a personal computer, a portable computer, a workstation, a computer terminal, a network computer, a television, a mainframe, or any other data processing system or user device. Due to the ever-changing nature of computers and networks, the description of computer system 810 depicted in FIG. 8 is intended only as a specific example for purposes of illustrating the preferred embodiments of the present invention. Many other configurations of computer system 810 are possible having more or less components than the computer system depicted in FIG. 8.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference in the Background section of this patent application are specifically incorporated by reference into the description herein of embodiments of the invention. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method for numerically solving a system of at least one circuit equation for a solution vector X having at least one value, comprising the steps of:
    developing the system of simultaneous circuit equations in dependence upon a circuit design;
    expressing the system of circuit equations in the form $0 = F(X)$, where F(X) is a vector of functions in X, the vector of functions having at least one function;
    choosing a starting vector $X_0$;
    calculating a solution vector $X_N$ to the system of circuit equations by iterating $X_{n+1} = X_n - [F'(X_n) + \sigma_n \text{Diag } F'(X_n)]^{-1} F(X_n)$ for n=0, 1, 2, ..., N, for some value of N>1, where Diag $F'(X_n)$ denotes the diagonal of the matrix $F'(X_n)$, where $F'(X_n)$ denotes the derivative of the matrix $F(X_n)$, and where at least one $\sigma_n$ is a number greater than 0, and
    reporting to a user at least one value in dependence upon $X_N$, useful in analyzing the circuit design.

2. A method according to claim 1, further comprising the step of reporting $X_N$ to a user as a solution to the system of circuit equations.

3. A method according to claim 1, wherein $\sigma_n$ is defined according to a predetermined function which, with all other variables constant, approaches zero as $\|F(X_n)\|$ approaches zero, n0, 1, 2, ..., N.

4. A method according to claim 1, wherein $\sigma_n$ is defined according to a predetermined function which, with all other variables constant, approaches zero as n increases, n=0, 1, 2, ..., N.

5. A method according to claim 1, wherein $\sigma_n$ is defined according to a predetermined function which, with all other variables constant, is proportional to a ratio of the norm of the n'th residual to the norm of the (n−1)'th residual, n=1, 2, ..., N.

6. A method according to claim 1, wherein whenever the entries on the diagonal of the Jacobian matrix $F'(X_n)$ are all positive, n=0, 1, 2, ..., N, and $\sigma_n$ is chosen such that $$\frac{\sigma_n}{2} \text{Diag} F'(X_n) + F'(X_n)$$

is positive definite.

7. A method according to claim 1, wherein $\sigma_n$ is defined according to a predetermined function dependent upon at least $\|F(X_n)\|$, and limited in magnitude by an upper bound function independent of $\|F(X_n)\|$, n=0, 1, 2, ..., N.

8. A method according to claim 7, wherein the upper bound function limits each $\sigma_n$ to β/n, for some constant β that is fixed for all n in the step of iterating.

9. A method according to claim 7, wherein in the predetermined function, for n>0:

$\sigma_n = [(\alpha_n/(1+n\alpha_n)]\|F(X_n)\|$ where $\alpha_n = \|F(X_n)\|/\|F(X_{n-1})\|$.

10. A method according to claim 9, wherein in the predetermined function, for n=0:

$\sigma_n = \|F(X_0)\|$.

11. A method according to claim 9, wherein in the predetermined function, for n=0 and for some constant β that is fixed for all n in the step of iterating:

$\sigma_n = \min \{\beta, \|F(X_0)\|\}$.

12. A method according to claim 1, wherein $\sigma_n$ is defined according to a predetermined function in which, for n>0:

$\sigma_n = [(\alpha_n/(1+n\alpha_n)]\|F(X_n)\|$ where $\alpha_n = \|F(X_n)\|/\|F(X_{n-1})\|$.

13. A method according to claim 12, wherein in the predetermined function, for n=0:

$\sigma_n = \|F(X_0)\|$.

14. A method according to claim 12, wherein in the predetermined function, for n=0 and for some constant β that is fixed for all n in the step of iterating:

$\sigma_n = \min \{\beta, \|F(X_0)\|\}$.

15. A method according to claim 1, wherein $\sigma_n$ is given by, for n>0 and for some constant β that is fixed for all n in the step of iterating:

$\sigma_n = \min \{\beta/n, [\alpha_n/(1+n\alpha_n)]\|F(X_n)\|\}$, where $\alpha_n = \|F(X_n)\|/\|F(X_{n-1})\|$.

16. A method according to claim 15, wherein $\sigma_n$ is given further by, for n=0:

$\sigma_n = \|F(X_0)\|$.

17. A method according to claim 15, wherein $\sigma_n$ is given further by, for n=0:

$$\sigma_n = \min\{\beta, \|F(X_0)\|\}.$$

18. A method for numerically solving a system of at least one continuity equation for a solution vector X having at least one value, comprising the steps of:
  imposing a mesh on a volume to be modeled, the mesh having a plurality of nodes;
  determining a system of continuity equations for species concentrations at each node in the plurality;
  expressing the system of continuity equations in the form $$0 = F(X^0),$$

where F(X) is a vector of functions in X, the vector of functions having at least one function;
  choosing a starting vector $X_0^0$;
  calculating a solution vector $X_{N^0}^0$ to the system of continuity equations by iterating $$X_{n+1}^0 = X_n^0 - [F'(X_n^0) + \sigma_n^0 \mathrm{Diag}\, F'(X_n^0)]^{-1} F(X_n^0)$$

for n=0, 1, 2, ..., $N^0$, for some value of $N^0 > 1$, where Diag $F'(X_n^0)$ denotes the diagonal of the matrix $F'(X_n^0)$, where $F'(X_n^0)$ denotes the derivative of the matrix $F(X_n^0)$, and wherein at least one $\sigma_n^0$ is a number greater than 0, and
  reporting to a user at least one value in dependence upon $X_{N^0}^0$ useful in analyzing the species concentrations in the volume.

19. A method according to claim 18, further comprising the step of reporting $X_{N^0}^0$ to a user as a solution to the system of continuity equations.

20. A method according to claim 18, wherein $\sigma_n^0$ is defined according to a predetermined function which, with all other variables constant, approaches zero as $\|F(X_n^0)\|$ approaches zero.

21. A method according to claim 18, wherein $\sigma_n^0$ is defined according to a predetermined function which, with all other variables constant, approaches zero as n increases.

22. A method according to claim 18, wherein $\sigma_n^0$ is defined according to a predetermined function which, with all other variables constant, is proportional to a ratio of the norm of the n'th residual to the norm of the (n−1)'th residual, n>0.

23. A method according to claim 18, wherein whenever the entries on the diagonal of the Jacobian matrix $F'(X_n^0)$ are all positive, n=0, 1, 2, ..., N, $\sigma_n^0$ is chosen such that $$\frac{\sigma_n^0}{2} \mathrm{Diag} F'(X_n^0) + F'(X_n^0)$$

is positive definite.

24. A method according to claim 18, wherein $\sigma_n^0$ is defined according to a predetermined function dependent upon at least $\|F(X_n^0)\|$, and limited in magnitude by an upper bound function independent of $\|F(X_n^0)\|$.

25. A method according to claim 24, wherein the upper bound function limits each $\sigma_n^0$ to $\beta/n$, for some constant $\beta$ that is fixed for all n in the step of iterating.

26. A method according to claim 24, wherein in the predetermined function, for n>0:

$$\sigma_n^0 = [(\alpha_n^0/(1+n\alpha_n^0)]\|F(X_n^0)\|$$

where $$\alpha_n^0 = \|F(X_n^0)\|/\|F(X_{n-1}^0)\|.$$

27. A method according to claim 26, wherein in the predetermined function, for n=0:

$$\sigma_n^0 = \|F(X_0^0)\|.$$

28. A method according to claim 26, wherein in the predetermined function, for n=0 and for some constant $\beta$ that is fixed for all n in the step of iterating:

$$\sigma_n = \min\{\beta, \|F(X_n^0)\|\}.$$

29. A method according to claim 18, wherein $\sigma_n^0$ is defined according to a predetermined function in which, for n>0:

$$\sigma_n^0 = [(\alpha_n^0/(1+n\alpha_n^0)]\|F(X_n^0)\|$$

where $$\alpha_n^0 = \|F(X_n^0)\|/\|F(X_{n-1}^0)\|.$$

30. A method according to claim 29, wherein in the predetermined function, for n=0:

$$\sigma_n^0 = \|F(X_0^0)\|.$$

31. A method according to claim 29, wherein in the predetermined function, for n=0 and for some constant $\beta$ that is fixed for all n in the step of iterating:

$$\sigma_n^0 = \min\{\beta, \|F(X_0^0)\|\}.$$

32. A method according to claim 18, wherein $\sigma_n^0$ is given by, for n>0 and for some constant $\beta$ that is fixed for all n in the step of iterating:

$$\sigma_n^0 = \min\{\beta/n, [\alpha_n^0/(1+n\alpha_n^0)]\|F(X_n^0)\|\},$$

where $$\alpha_n^0 = \|F(X_n^0)\|/\|F(X_{n-1}^0)\|.$$

33. A method according to claim 32, wherein $\sigma_n^0$ is given further by, for n=0:

$$\sigma_n^0 = \|F(X_0^0)\|.$$

34. A method according to claim 32, wherein $\sigma_n^0$ is given further by, for n0:

$$\sigma_n^0 = \min\{\beta, \|F(X_0^0)\|\}.$$

35. A method according to claim 18, further comprising the steps of, after the $N^0$'th iteration in the step of iterating:
  assigning a next starting vector $X_0^1 = X_N^0$; and
  iterating $$X_{n+1}^1 = X_n^1 - [\mathrm{Diag}\, F'(X_n^1) + \sigma_n^1 F'(X_n^1)]^{-1} F(X_n^1)$$

for n=0, 1, 2, ..., $N^1$, for some value of $N^1 > 1$, where Diag $F'(X_n^1)$ denotes the diagonal of the matrix $F'(X_n^1)$, and where each $\sigma_n^1$ is a number greater than 0.

36. A method according to claim 18, for use in semiconductor device modeling, wherein one of the species modeled in the continuity equations comprises charge carriers.

37. A method according to claim 36, wherein the continuity equations model both electrons and holes.

38. A method according to claim 18, wherein one of the species modeled in the continuity equations comprises heat.

39. A method according to claim 18, for use in semiconductor device modeling, wherein one of the species modeled in the continuity equations comprises a member of the group consisting of a dopant, a self-interstitial, and a vacancy.

40. A method for numerically modeling species concentrations in a volume, comprising the steps of:
  imposing a mesh on a volume to be modeled, the mesh having a plurality of nodes;
  determining continuity equations for species concentrations at each node in the plurality;

expressing the continuity equations in the form $$0 = F(X^t),$$

where $F(X)$ is a vector of functions in X, the vector of functions having at least one function, and $X^t$ is a solution vector at time step t having at least one value;
choosing a starting vector $X_0^0$;
calculating a solution vector $X_{N^0}^0$ to the system of continuity equations by iterating $$X_{n+1}^0 = X_n^0 - [F'(X_n^0) + \sigma_n^0 \text{Diag } F'(X_n^0)]^{-1} F(X_n^0)$$

for $n = 0, 1, 2, \ldots, N^0$, for some value of $N^0 > 1$, where Diag $F'(X_n^0)$ denotes the diagonal of the matrix $F'(X_n^0)$, where $F'(X_n^0)$ denotes the derivative of the matrix $F(X_n^0)$, and wherein at least one $\sigma_n^0$ is a number greater than 0,
and for each time increment t, $t = 1, 2, \ldots, T$, for some value of $T > 1$:
assigning a next starting vector $X_0^{t=X}{}_{N^{t-1}}^{t-1}$;
calculating a solution vector $X_{N^t}^t$ by iterating $$X_{n+1}^t = X_n^t - [F'(X_n^t) + \sigma_n^t \text{Diag } F'(X_n^t)]^{-1} F(X_n^t)$$

for $n = 0, 1, 2, \ldots, N^t$, for some value of $N^t > 1$, wherein at least one $\sigma_n^t$ is a number greater than 0, and
reporting to a user at least one value in dependence upon $X_{N^t}^t$, useful in analyzing the species concentrations in the volume.

41. A computer program product for numerically solving a system of at least one equation for a solution vector X having at least one value, the computer program product comprising, in a computer readable medium:
code for expressing a system of simultaneous equations in the form $$0 = F(X),$$

where $F(X)$ is a vector of functions in X, the vector of functions having at least one function;
code for choosing a starting vector $X_0$; and
code for iterating $$X_{n+1} = X_n - [F'(X_n) + \sigma_n \text{Diag } F'(X_n)]^{-1} F(X_n)$$

for $n = 0, 1, 2, \ldots, N$, for some value of $N > 1$, where Diag $F'(X_n)$ denotes the diagonal of the matrix $F'(X_n)$, where $F'(X_n)$ denotes the derivative of the vector $F(X_n)$, and wherein at least one $\sigma_n$ is a number greater than 0.

42. A machine for numerically solving a system of at least one equation for a solution vector X having at least one value, the system comprising:
a memory;
a data processor coupled to the memory;
means for expressing a system of simultaneous equations in the form $$0 = F(X),$$

where $F(X)$ is a vector of functions in X, the vector of functions having at least one function;
means for choosing a starting vector $X_0$; and
means for iterating $$X_{n+1} = X_n - [F'(X_n) + \sigma_n \text{Diag } F'(X_n)]^{-1} F(X_n)$$

for $n = 0, 1, 2, \ldots, N$, for some value of $N > 1$, where $F'(X_n)$ denotes the derivative of the vector $F(X_n)$, and where at least one $\sigma_n$ is a number greater than 0.

43. A machine for numerically solving a system of at least one circuit equation for a solution vector X having at least one value, the system of circuit equations having been developed in dependence upon a circuit design, comprising:
a memory; and
a data processor coupled to the memory, the data processor configured to:
express the system of circuit equations in the form $$0 = F(X),$$

where $F(X)$ is a vector of functions in X, the vector of functions having at least one function;
choose a starting vector $X_0$;
calculate a solution vector $X_N$ to the system of circuit equations by iterating $$X_{n+1} = X_n - [F'(X_n) + \sigma_n \text{Diag } F'(X_n)]^{-1} F(X_n)$$

for $n = 0, 1, 2, \ldots, N$, for some value of $N > 1$, where Diag $F'(X_n)$ denotes the diagonal of the matrix $F'(X_n)$, where $F'(X_n)$ denotes the derivative of the matrix $F(X_n)$, and where at least one $\sigma_n$ is a number greater than 0, and
report to a user at least one value in dependence upon $X_N$, useful in analyzing the circuit design.

44. A machine according to claim 43, further comprising means for reporting $X_N$ to a user as a solution to the system of circuit equations.

45. A machine according to claim 43, wherein $\sigma_n$ is defined according to a predetermined function which, with all other variables constant, approaches zero as $\|F(X_n)\|$ approaches zero, $n = 0, 1, 2, \ldots, N$.

46. A machine according to claim 43, wherein $\sigma_n$ is defined according to a predetermined function which, with all other variables constant, is proportional to a ratio of the norm of the n'th residual to the norm of the (n−1)'th residual, $n = 1, 2, \ldots, N$.

47. A machine according to claim 43, wherein whenever the entries on the diagonal of the Jacobian matrix $F'(X_n)$ are all positive, $n = 0, 1, 2, \ldots, N$, and $\sigma_n$ is chosen such that $$\frac{\sigma_n}{2} \text{Diag} F'(X_n) + F'(X_n)$$

is positive definite.

48. A machine according to claim 43, wherein $\sigma_n$ is defined according to a predetermined function dependent upon at least $\|F(X_n)\|$, and limited in magnitude by an upper bound function independent of $\|F(X_n)\|$, $n = 0, 1, 2, \ldots, N$.

49. A machine according to claim 43, wherein $\sigma_n$ is defined according to a predetermined function in which, for $n > 0$:

$$\sigma_n = [(\alpha_n/(1 + n\alpha_n)] \|F(X_n)\|$$

where $$\alpha_n = \|F(X_n)\|/\|F(X_{n-1})\|.$$

50. A machine according to claim 43, wherein $\sigma_n$ is given by, for $n > 0$ and for some constant $\beta$ that is fixed for all n in the iteration:

$$\sigma_n = \min \{\beta/n, [\alpha_n/(1 + n\alpha_n)] \|F(X_n)\|\},$$

where $\alpha_n = \|F(X_n)\|/\|F(X_{n-1})\|$.

51. A machine according to claim 50, wherein $\sigma_n$ is given further by, for $n = 0$:

$$\sigma_n = \|F(X_0)\|.$$

52. A machine for numerically solving a system of at least one continuity equation for a solution vector X having at least one value, comprising:
- a memory; and
- a data processor coupled to the memory, the data processor configured to:
- impose a mesh on a volume to be modeled, the mesh having a plurality of nodes;
- determine a system of continuity equations for species concentrations at each node in the plurality;
- express the system of continuity equations in the form $$0 = F(X^0),$$

where F(X) is a vector of functions in X, the vector of functions having at least one function;
- choose a starting vector $X_0^0$;
- calculate a solution vector $X_{N^0}^0$ to the system of continuity equations by iterating $$X_{n+1}^0 = X_n^0 - [F'(X_n^0) + \sigma_n^0 \text{Diag } F'(X_n^0)]^{-1} F(X_n^0)$$

for n=0, 1, 2, ..., $N^0$, for some value of $N^0 > 1$, where Diag $F'(X_n^0)$ denotes the diagonal of the matrix $F'(X_n^0)$, where $F'(X_n^0)$ denotes the derivative of the matrix $F(X_n^0)$, and wherein at least one $\sigma_n^0$ is a number greater than 0, and
- report to a user at least one value in dependence upon $X_{N^0}^0$, useful in analyzing the species concentrations in the volume.

53. A machine according to claim 52, further comprising means for reporting $X_{N^0}^0$ to a user as a solution to the system of continuity equations.

54. A machine according to claim 52, wherein $\sigma_n^0$ is defined according to a predetermined function which, with all other variables constant, approaches zero as $\|F(X_n^1)\|$ approaches zero.

55. A machine according to claim 52, wherein $\sigma_n^0$ is defined according to a predetermined function which, with all other variables constant, is proportional to a ratio of the norm of the n'th residual to the norm of the (n−1)'th residual, n>0.

56. A machine according to claim 52, wherein whenever the entries on the diagonal of the Jacobian matrix $F'(X_n^0)$ are all positive, n=0, 1, 2, ..., N, $\sigma_n^0$ is chosen such that $$\frac{\sigma_n^0}{2} \text{Diag} F'(X_n^0) + F'(X_n^0)$$

is positive definite.

57. A machine according to claim 52, wherein $\sigma_n^0$ is defined according to a predetermined function dependent upon at least $\|F(X_n^0)\|$, and limited in magnitude by an upper bound function independent of $\|F(X_n^0)\|$.

58. A machine according to claim 52, wherein $\sigma_n^0$ is defined according to a predetermined function in which, for n>0:

$$\sigma_n^0 = [(\alpha_n^0/(1+n\alpha_n^0)] \|F(X_n^0)\|$$

where $$\alpha_n^0 = \|F(X_n^0)\| / \|F(X_{n-1}^0)\|.$$

59. A machine according to claim 58, wherein in the predetermined function, for n=0 and for some constant β that is fixed for all n in the iteration:

$$\sigma_n^0 = \min \{\beta, \|F(X_0^0)\|\}.$$

60. A machine according to claim 52, wherein $\sigma_n^0$ is given by, for n>0 and for some constant β that is fixed for all n in the iteration:

$$\sigma_n^0 = \min \{\beta/n, [\alpha_n^0/(1+n\alpha_n^0)] \|F(X_n^0)\|\},$$

where $$\alpha_n^0 = \|F(X_n^0)\| / \|F(X_{n-1}^0)\|.$$

61. A machine according to claim 60, wherein $\sigma_n^0$ is given further by, for n=0:

$$\sigma_n^0 = \|F(X_0^0)\|.$$

62. A machine according to claim 60, wherein $\sigma_n^0$ is given further by, for n=0:

$$\sigma_n^0 = \min \{\beta, \|F(X_0^0)\|\}.$$

63. A machine according to claim 52, wherein the data processor is configured further to, after the $N^0$'th iteration:
- assign a next starting vector $X_0^1 = X_N^0$; and
- iterate $$X_{n+1}^1 = X_n^1 - [\text{Diag } F'(X_n^1) + \sigma_n^1 F'(X_n^1)]^{-1} F(X_n^1)$$

for n=0, 1, 2, ..., $N^1$, for some value of $N^1 > 1$, where Diag $F'(X_n^1)$ denotes the diagonal of the matrix $F'(X_n^1)$, and where each $\sigma_n^1$ is a number greater than 0.

64. A machine for numerically modeling species concentrations in a volume, comprising:
- a memory; and
- a data processor coupled to the memory, the data processor configured to:
- impose a mesh on a volume to be modeled, the mesh having a plurality of nodes;
- determine continuity equations for species concentrations at each node in the plurality;
- express the continuity equations in the form $$0 = F(X^t),$$

where F(X) is a vector of functions in X, the vector of functions having at least one function, and $X^t$ is a solution vector at time step t having at least one value;
- choose a starting vector $X_0^0$;
- calculate a solution vector $X_{N^0}^0$ to the system of continuity equations by iterating $$X_{n+1}^0 = X_n^0 - [F'(X_n^0) + \sigma_n^0 \text{Diag } F'(X_n^0)]^{-1} F(X_n^0)$$

for n=0, 1, 2, ..., $N^0$, for some value of $N^0 > 1$, where Diag $F'(X_n^0)$ denotes the diagonal of the matrix $F'(X_n^0)$, where $F'(X_n^0)$ denotes the derivative of the matrix $F(X_n^0)$, and wherein at least one $\sigma_n^0$ is a number greater than 0,
- and for each time increment t, t=1, 2, ..., T, for some value of T>1:
- assign a next starting vector $X_0^t = X_{N^{t-1}}^{t-1}$;
- calculate a solution vector $X_{N^t}^t$ by iterating $$X_{n+1}^t = X_n^t - [F'(X_n^t) + \sigma_n^t \text{Diag } F'(X_n^t)]^{-1} F(X_n^t)$$

for n=0, 1, 2, ..., $N^0$, for some value of Nt>1, wherein at least one $\sigma_n^t$ is a number greater than 0, and
- reporting to a user at least one value in dependence upon $X_{N^t}^t$, useful in analyzing the species concentrations in the volume.

* * * * *

UNITED STATES PATENT AND TRADEMARK OFFICE
CERTIFICATE OF CORRECTION

PATENT NO. : 7,302,375 B2  Page 1 of 1
APPLICATION NO. : 10/929286
DATED : November 27, 2007
INVENTOR(S) : Andrey Kucherov et al.

It is certified that error appears in the above-identified patent and that said Letters Patent is hereby corrected as shown below:

Column 19, line 67, "zero, n0" should read -- zero, n=0 --.
Column 20, line 29, that portion of the equation reading "=[($\alpha$ " should read -- =[$\alpha$ --; and column 20, line 29, that portion of the equation reading "=[($\alpha$" should read -- =[$\alpha$ --.
Column 22, line 8, that portion of the equation reading "$\sigma_n$ = min" should read -- $\sigma_n^0$ = min --;

and column 22, line 39, "for n0" should read -- for n=0 --.

Column 23, line 19, the equation reading "$X_0^t = X_{N^{t-1}}^{t-1}$" should read -- $X_0^t = X_{N^{t-1}}^{t-1}$ --.

Column 24, line 48, that portion of the equation reading "$(X_n)_\|$, $_{n=}$ 0" should read -- $(X_n)\|$, n=0 --;
and column 24, line 53, that portion of the equation reading "[($\alpha_n$/" should read -- [$\alpha_n$ / --; and column 24, line 63, that portion of the equation reading "$\|/\| \; F$" should read -- $\|/\| F$ --; and
column 24, line 67, that portion of the equation reading "$\sigma_{n=\|} F$" should read -- $\sigma_n = \| F$ --.
Column 25, line 55, that portion of the equation reading "[($\alpha$" should read -- [$\alpha$ --.

Signed and Sealed this

Twenty Second Day of April, 2008

JON W. DUDAS
*Director of the United States Patent and Trademark Office*